United States Patent
Sunter et al.

(10) Patent No.: US 6,895,535 B2
(45) Date of Patent: May 17, 2005

(54) CIRCUIT AND METHOD FOR TESTING HIGH SPEED DATA CIRCUITS

(75) Inventors: Stephen K. Sunter, Nepean (CA); Aubin P. J. Roy, Gatineau (CA)

(73) Assignee: LogicVision, Inc., San Jose, CA (US)

( * ) Notice: Subject to any disclaimer, the term of this patent is extended or adjusted under 35 U.S.C. 154(b) by 0 days.

(21) Appl. No.: 10/727,583

(22) Filed: Dec. 5, 2003

(65) Prior Publication Data

US 2004/0123197 A1 Jun. 24, 2004

Related U.S. Application Data

(60) Provisional application No. 60/433,989, filed on Dec. 18, 2002.

(51) Int. Cl.$^7$ .......................... G06F 11/00; G01R 31/08
(52) U.S. Cl. ...................................... 714/704; 324/527
(58) Field of Search ................................ 714/724, 740, 714/704, 708; 324/76.15, 527, 771, 158.1

(56) References Cited

U.S. PATENT DOCUMENTS

| | | | | |
|---|---|---|---|---|
| 5,325,397 A | * | 6/1994 | Scholz et al. ................ 375/224 |
| 5,606,317 A | * | 2/1997 | Cloonan et al. .............. 341/58 |
| 6,034,551 A | * | 3/2000 | Bridgewater, Jr. ............ 326/82 |
| 6,587,530 B1 | * | 7/2003 | Conklin et al. .............. 375/372 |
| 2002/0183003 A1 | * | 12/2002 | Chang et al. .................. 455/41 |
| 2004/0030968 A1 | * | 2/2004 | Fan et al. ..................... 714/704 |

OTHER PUBLICATIONS

Cai et al., "Jitter Testing for Gigabit Serial Communication Transceivers", Design & Test, Jan.–Feb. 2003, p. 66–74, IEEE Circuits & Systems Society, USA.
Burns et al., "An Introduction to Mixed–Signal IC Test and Measurement", Feb. 8, 2001, p. 399–400, Oxford University Press.

* cited by examiner

*Primary Examiner*—Guy J. Lamarre
*Assistant Examiner*—Cynthia Britt
(74) *Attorney, Agent, or Firm*—Eugene E. Proulx

(57) ABSTRACT

A circuit and method are described in which a DC voltage or current is connected to a high frequency, AC-coupled signal path between a transmitter and a receiver, and the bit error rate of the data transmission is tested while applying an altered bias voltage to the received signal. The bias voltage can be connected via a resistor, inductor or transistors. The transmitted signal is attenuated resistively, and a load capacitance is applied whose value causes digital transition times to exceed one unit interval. An intended application is testing of an integrated circuit, serializer/deserializer (serdes) operating above 1 GHz.

15 Claims, 10 Drawing Sheets

Data dependent jitter caused by a simple RC low pass filter

Transmitted +/−

$V_{ADJ}$ equal to $V_{REF}$

Received +/−

$V_{ADJ}$ not equal to $V_{REF}$

Received +
Received −

US 6,895,535 B2

1

CIRCUIT AND METHOD FOR TESTING HIGH SPEED DATA CIRCUITS

CROSS-REFERENCE TO RELATED APPLICATIONS

This application claims the benefit of U.S. Provisional Patent Application Ser. No. 60/433,989 filed Dec. 18, 2002.

BACKGROUND OF THE INVENTION

1. Field of the Invention

The present invention generally relates to the testing of circuits, and, more specifically, to testing the data transmission performance of circuits that transmit and/or receive high speed, serial data.

2. Description of Related Art

As the data rate of IC pins increases each year, well beyond a few gigahertz, it becomes necessary to consider embedding test capabilities in an integrated circuit (IC) so that a tester will not need to operate accurately at the data rate being tested.

In automatic test equipment (ATE), it is common to include a parametric measurement unit (PMU) to measure the drive of an IC's output pin, or to accurately deliver a DC voltage. The output drive of a pin is tested by applying a known current to the pin and measuring the resultant voltage at the pin, or by applying a known voltage and measuring the resultant current. As shown in FIG. 1, a DC voltage 10 is accurately delivered to a pin 12 of an IC 14 by applying (forcing) a voltage via a first conductive path 16 of the test equipment 20 and sensing the applied voltage via a second conductive path 18 of the test equipment. Typically, an operational amplifier 22 is used to adjust the applied voltage until the sensed voltage is equal to the desired voltage. The "conductive paths" typically comprise wires, board-to-board interface connectors, and electromechanical relays. Although a PMU can deliver and measure a signal accurately, it is only suitable for DC or very low frequencies.

A standard entitled "IEEE Standard for a Mixed Signal Test Bus", was published in 1999 by the IEEE, and is known as IEEE Std. 1149.4-1999, or simply 1149.4. The general architecture of an IC designed according to 1149.4 is shown in FIG. 2. This test bus was primarily designed to permit the measurement of discrete passive components, including capacitors and resistors, that are connected to the pins of ICs. It is intended for applying a stimulus current or voltage to a pin, via one of these test buses, AB1 or AB2, and simultaneously monitoring the pin's response voltage via another, AB2 or AB1, of these test buses, and to thus determine the impedance of a circuit that has been connected to a pin. A boundary scan cell 24 for an individual pin 12 is shown in FIG. 3. 1149.4 offers a way to embed test capabilities in an IC, but it is only practical for fairly low frequencies, much lower than the gigahertz rate at which some ICs transmit signals.

A primary difficulty in testing gigahertz signals is maintaining signal integrity when accessing the signals. The typical way of improving the signal integrity of a transmission line is to terminate it with an impedance $R_L$ equal to the characteristic impedance of the transmission line. In the case of differential signals, the termination resistor is typically connected between the differential signals and has a value equal to twice the characteristic impedance (typically 50 ohms) of individual the transmission lines. Low voltage differential signaling (LVDS) circuits typically use a differential current driver and terminate the differential pair at the

2 receiver with a three-resistor combination that is intended to provide a small constant voltage offset to the differential signal so that if one of the signal wires is open circuit, the input to the receiver will appear to have a constant voltage and appear as a constant logic value instead of being intermittent.

A variety of termination and biasing circuits are possible—some commonly used circuits are shown in FIGS. 4A, 4B, 4C, and 4D. AC coupling allows the common mode (average) voltage of the received signal to be optimized for the receiver, independent of the transmitted common mode voltage.

Another standard is entitled, "IEEE 1149.6: Standard for Boundary-Scan Testing of Advanced Digital Networks", describes a method for testing differential signals that are AC-coupled.

Bit error rate testing is a common way of testing the performance of a digital communication system. Typical high frequency signals (greater than 1 Gb/s) achieve a bit error rate (BER) better than 1 in $10^{12}$ bits. To test this performance it is necessary to test at least $10^{12}$ bits, and at 1 Gb/s this can take 1000 seconds, which is too long for production testing. Some circuits are simply tested for less than one second to verify that no bit errors are detected, but this is not a very thorough test. A prior art method to make a short duration BER test more meaningful is to inject noise or jitter. This is sometimes referred to as "stressed eye" testing.

A prior art method for injecting data dependent jitter into a high speed serial bit stream was published in Design & Test January 2002, and is entitled, "Jitter Testing for Gigabit Serial Communication Transceivers", by Yi Cai et al. To test a data path, a differential signal drives a series resistance and a capacitor is connected across the differential output which is then looped back into a differential input. This has the effect of injecting data dependent jitter because the mid-level crossing time depends on the preceding number of ones and zeroes, as shown in FIG. 5. However, the capacitor value might need to be very accurate and very small: for a 2.5 Gb rate, the unit interval (UI) is 400 ps, so using the standard 100 ohm termination resistor, and setting RC=1 UI, then C must equal 400 ps/100 ohms=4 pF, which is equal to the typical capacitance of one or two centimeters of wire on a printed circuit board, and is very sensitive to any stray capacitances.

SUMMARY OF THE INVENTION

The present invention seeks to provide a method and circuitry for parametrically testing circuits that transmit and/or receive high frequency data (for example, higher than 1 Gb/s), using only low frequency digital and analog test circuitry. The present invention also seeks to provide signal delivery in a way that is compatible with the IEEE 1149.1, 1149.4, and 1149.6 test access standards.

In general, the method of the present invention is intended for testing circuits that transmit and/or receive data values via high frequency signals, using only low frequency analog test circuitry, and comprises coupling a transmitter of the signals to a receiver via a capacitance, $C_{AC}$, and connecting an input of the receiver to a bias voltage, applying a source of DC current to the receiver input via an impedance, $R_B$, transmitting one or more sequences of different data values while applying one of at least two values of the DC current; and testing received data values.

In one embodiment, a differential output signal is attenuated relative to its normal voltage swing, and filtered by a capacitor whose value is chosen to have a known time constant that is comparable to a data bit duration (unit interval). The filtered signal is AC-coupled to the inputs of a differential receiver, and the inputs to the receiver are biased to different DC voltages. While monitoring the bit error rate (BER), one or both bias voltages are adjusted to increase or decrease the amplitude of single-ended logic 1's in the received signal, and the number of consecutive logic 1's is also adjusted, so that the effect of the filter capacitor permits the received edge timing to be adjusted precisely. In this way, a BER that can be tested in less than one second can be measured, and it will be indicative of the BER that less attenuation, filtering, and edge delays cause in the end application. The amplitude of the high bit-rate signal is calculated based on measured average voltages of the data signal while the percentage and grouping of logic 1's in the data signal are adjusted. The method and circuitry can also be used for single-ended signals.

The test circuit of the present invention comprises a transmitter for transmitting high frequency signals, a receiver for receiving the signals; a coupling capacitor connected between the transmitter and the receiver; and means for generating a variable bias voltage connected to at least one receiver input.

BRIEF DESCRIPTION OF THE DRAWINGS

These and other features of the invention will become more apparent from the following description in which reference is made to the appended drawings in which.

DETAILED DESCRIPTION OF EMBODIMENTS OF THE INVENTION

In the following detailed description, numerous specific details are set forth in order to provide a thorough understanding of the present invention, However, it will be understood by those skilled in the art that the present invention may be practiced without these specific details. In other instances, well known methods, procedures, components and circuits have not been described in detail so as not to obscure aspects of the present invention.

As mentioned previously, the method of the present invention is intended for testing circuits that transmit and/or receive data values via high frequency signals, using only low frequency analog test circuitry, and generally comprises coupling a transmitter of the signals to a receiver via a capacitance $C_{AC}$ and connecting an input of the receiver to a bias voltage, applying a source of DC current to the receiver input via an impedance, $R_B$, which may be a resistor as shown or an inductance, transmitting one or more sequences of different data values while applying one of at least two values of the DC current; and testing received data values.

The step of applying a source of DC current includes applying either a DC constant current source or a DC constant voltage source to the receiver. When the receiver input is differential, the step of applying a source of DC current includes applying two separate current sources to the receiver. Application of two separate currents sources includes applying two currents which have substantially equal but opposite values or applying two DC constant voltage sources whose voltage values are equal to the voltage that would be measured at the outputs of the DC constant current sources.

The method further includes selecting transmitted data values so as to increase the susceptibility of signals to circuit parameters.

The step of testing received data values includes measuring bit error rate of the signals.

The method further includes attenuating the signal level of the transmitted signal relative to its maximum signal level. This may be performed by reducing the drive current of the transmitter, connecting a resistor network between the transmitter and the receiver, and connecting a load capacitor.

Figure 6A:
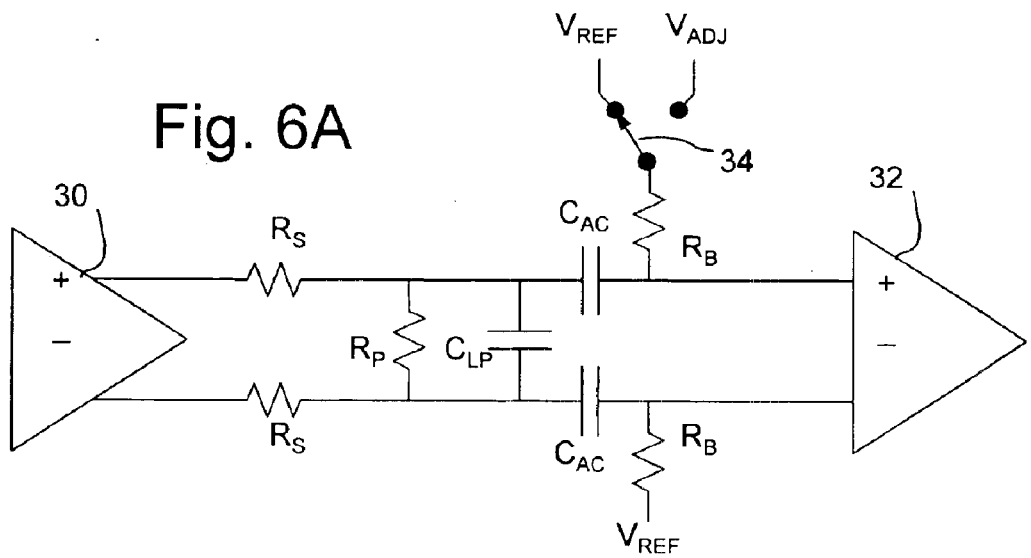
FIG. 6A is a schematic of an AC-coupled differential driver and receiver, with signal attenuation, low pass filtering, adjustable bias voltages, and low frequency test access resistors, according to an embodiment of the present invention.

FIG. 6A shows a transmitter 30 and a receiver 32. The average voltage of the signals at the receiver is controlled via bias resistors $R_B$. A switch 34 serves as a means for generating a variable bias voltage and is connected to the receiver inputs to permit selection of a typical bias voltage, $V_{REF}$, or an adjustable voltage $V_{ADJ}$. Alternatively, the switch-selectable bias voltage could be applied to the inverting input, or to both inputs. If $V_{REF}$ is adjustable, then the switch is unnecessary. One or more AC-coupling capacitors $C_{AC}$ are connected between the transmitter and the receiver.

The sequence of data values (bit pattern) that can be transmitted is typically easily programmed, although sometimes a coding scheme places restrictions on patterns. For example, the standard 8b10b coding scheme converts 8-bit data words into 10-bit words in which the number of consecutive same-value bits is limited to five, to minimize the variation in the average voltage of the signal.

Figure 6B:
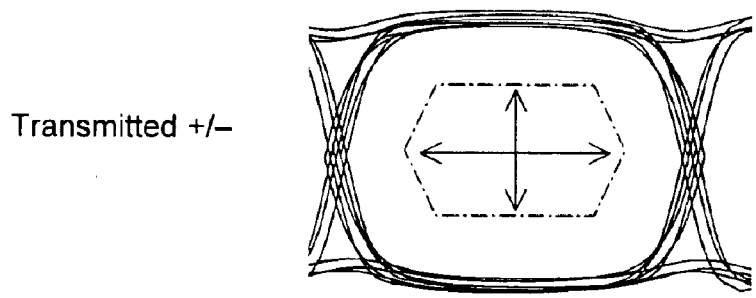
FIG. 6B shows many super-imposed transmit waveforms, commonly known as an eye-diagram, for both the inverting (−) and non-inverting (+) signals.

A more specific objective of the invention is to measure the received data eye-opening, as perceived by the receiver circuitry. The received eye-opening, as shown in the waveforms of FIG. 6B, might be significantly smaller than the transmitted eye-opening, due to noise, signal attenuation, and jitter.

Resistors $R_S$ and $R_P$ form an attenuator, with gain less than 1, whose input resistance is equal to $2R_S+R_P$ and equal to the load resistance specified for the transmitter—typically this is the characteristic impedance of transmission lines that might be connected to the transmitter in an application. The attenuation will be equal to $R_P/(2R_S+R_P)$. Therefore, $R_S$ is made equal to $0.5Z_0(1-\text{gain})$, and $R_P$ is made equal to $Z_0-2R_S$. For example, a common characteristic impedance for a differential transmission line is $Z_0=100$ ohms. For gain=0.2, $R_S$ will be $0.5\times100\times(1-0.2)=40$ ohms, and $R_P$ will be $100-(2\times40)=20$ ohms.

The resistive attenuator serves two purposes: it attenuates the signal so that the received bit error rate (BER) will be significantly degraded relative to a direct connection between the transmitter and the receiver, and the reduced output impedance ($R_P$) permits a larger value of $C_{LP}$ to be used, and hence achieves greater accuracy in the corner frequency of the low pass filter formed by $R_P$ and $C_{LP}$. The corner frequency is equal to $1/(2\pi R_P C_{LP})$. The desired value of $R_P C_{LP}$ is approximately equal to 1~3 UI, so that the amount of eye-opening can be increased by sending more consecutive identical bits in series. For 4 GHz signals, 1~3 UI corresponds to 250~750 ps. Without an attenuator, the 100 ohm characteristic impedance would mean that $C_{LP}$ would be between 2.7 and 7.5 picofarads (pF), which is very small and difficult to implement accurately on a circuit board, or even on an integrated circuit. The attenuator permits $C_{LP}$ to be larger by a factor of 1/gain, and hence the accuracy requirements are easier to achieve. Gain that is between 0.1 and 0.5 will typically cause the BER to degrade sufficiently to cause bit errors in seconds instead of hours; for example, to $10^{-8}$ instead of $10^{-12}$.

The following procedure is used for testing the received minimum and maximum voltage limits of the eye-opening, using the circuit of FIG. 6A.

Figure 6C:
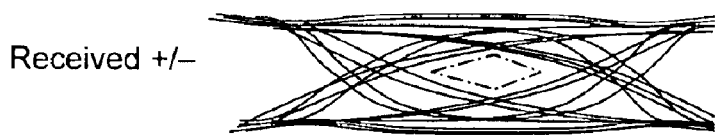
FIG. 6C shows a reduced opening eye-diagram of the received waveforms, after attenuation and low pass filtering, for both the inverting (−) and non-inverting (+) signals, with $V_{REF}$ bias applied to both inputs.
Figure 6D:
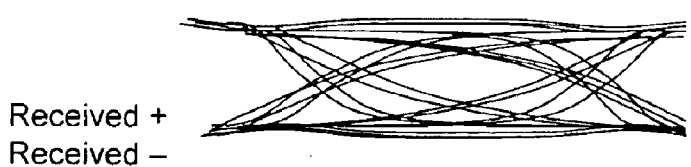
FIG. 6D shows a further reduced opening eye-diagram of the received waveforms, after attenuation and low pass filtering, for both the inverting (−) and non-inverting (+) signals, with $V_{ADJ}$ bias applied to one input.
Figure 6E:
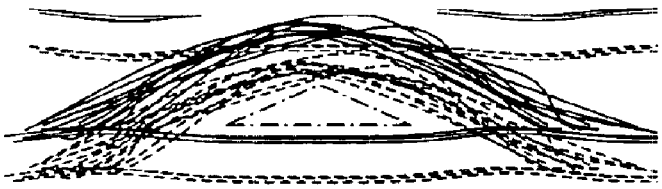
FIG. 6E shows an altered opening eye-diagram of the received waveforms, after attenuation and low pass filtering, for both the inverting (−) and non-inverting (+) signals, with $V_{ADJ}$ bias applied to one input, and isolated logic 1's in a sequence of logic 0's.
Figure 6F:
FIG. 6F shows an altered opening eye-diagram of the received waveforms, after attenuation and low pass filtering, for both the inverting (−) and non-inverting (+) signals, with $V_{ADJ}$ bias applied to one input, and isolated logic 0's in a sequence of logic 1's.
Figure 6G:
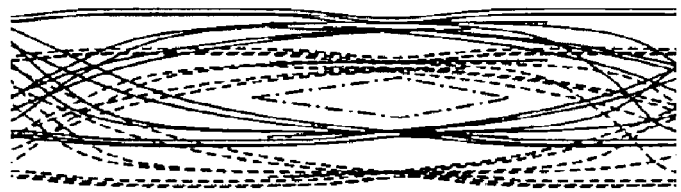
FIG. 6G shows an increased opening eye-diagram of the received waveforms, after attenuation and low pass filtering, for both the inverting (−) and non-inverting (+) signals, with $V_{ADJ}$ bias applied to one input, and pairs of logic 1's and 0's.

1. With the bias switch set to $V_{REF}$, apply a pseudo-random pattern to verify basic functionality. For example, apply 8K bits, and measure the received BER (it may be zero). The eye-opening will be similar to that shown in FIG. 6C.
2. With the bias switch set to $V_{ADJ}$, and $V_{ADJ}=V_{REF}-\Delta V$, apply a pseudo-random pattern to verify basic functionality. For example apply 8 K bits, and measure, received BER (it should be non-zero). $\Delta V$ is chosen (by adjustment or by previous characterization) to cause a BER for this test to be approximately 1 per 1000 bits ($10^{-3}$). The decreased eye-opening will be similar to that shown in FIG. 6D, which depicts the decreased overlap of the single-ended signals.
3. Repeat step 2 with the same $\Delta V$, using a pattern of alternating 1's and 0's (i.e., 10101010). The eye-opening will be similar to that shown in FIG. 6D, but with less jitter.
4. Repeat step 2 with the same $\Delta V$, using a pattern of isolated 1's in a field of 0's (i.e., 1110010011100100). The eye-opening will be similar to that shown in FIG. 6E.
5. Repeat step 2 with the same $\Delta V$, using a pattern of isolated 0's in a field of 1's (i.e., 0001101100011011). The eye-opening will be similar to that shown in FIG. 6F.
6. Repeat step 2 with the same $\Delta V$, using a pattern comprised of groups of 1's in a field of 0's (i.e., 0001111000011110). The eye-opening will be similar to that shown in FIG. 6G, if the groups are pairs of 1's and pairs of 0's.

Each of the above patterns stresses a different capability of the receiver, however other patterns are possible. Step 2 measures the BER for a minimum eye-opening height, and total jitter (random and deterministic). Step 3 measures the BER for a minimum eye-opening and random jitter (no data-dependent jitter). Steps 4 and 5 measure the width of the window, by accurately reducing the width (and height) using the RC of the attenuator. Step 6 measures the height of the window (scaled by the gain of the attenuator) by accurately reducing the height until the BER exceeds some pre-determined threshold.

Figure 1:
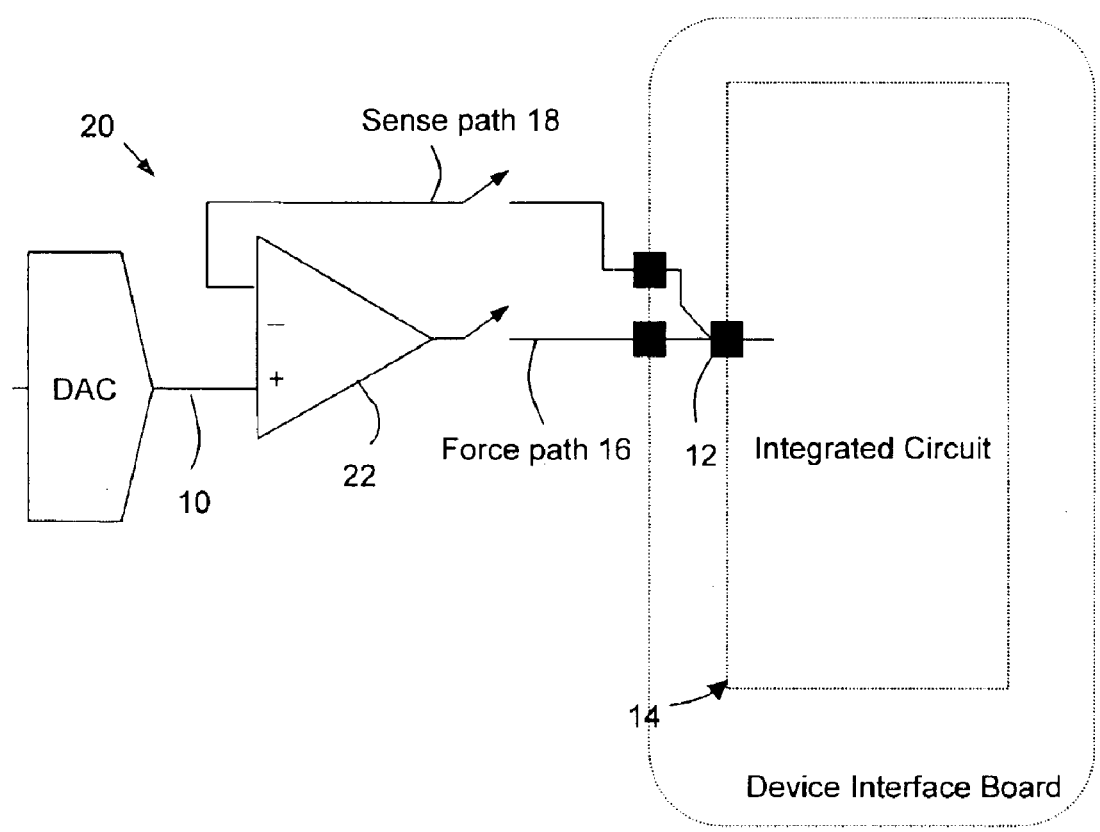
FIG. 1 is a schematic of a prior art of a tester stimulus signal source that has force/sense.
Figure 2:
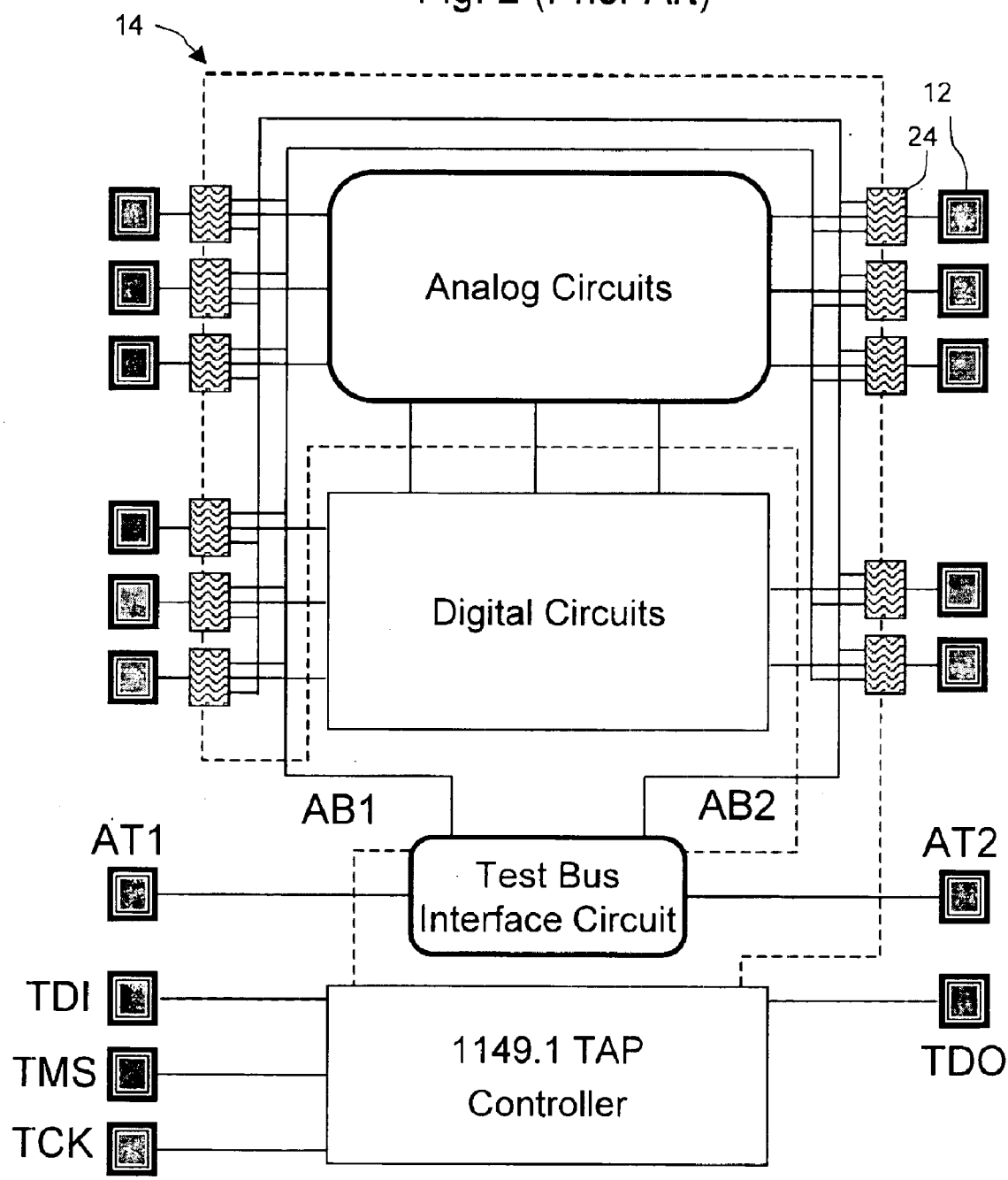
FIG. 2 is a schematic of the prior art architecture of an 1149.4-compatible IC.
Figure 3:
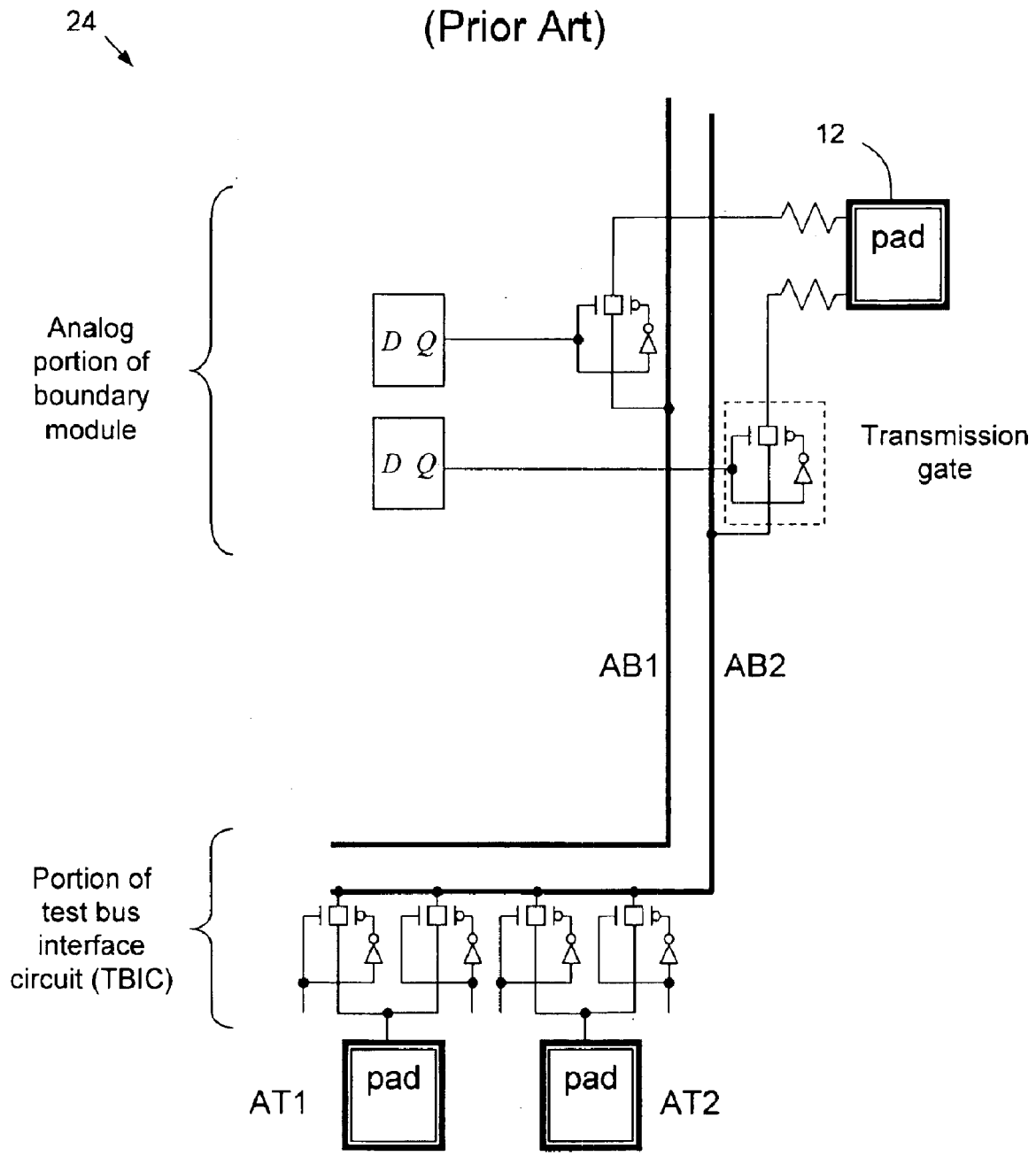
FIG. 3 is a schematic of a of a portion of a typical prior art 1149.4 boundary module and a portion of a test bus interface circuit (TBIC).
Figure 4A:
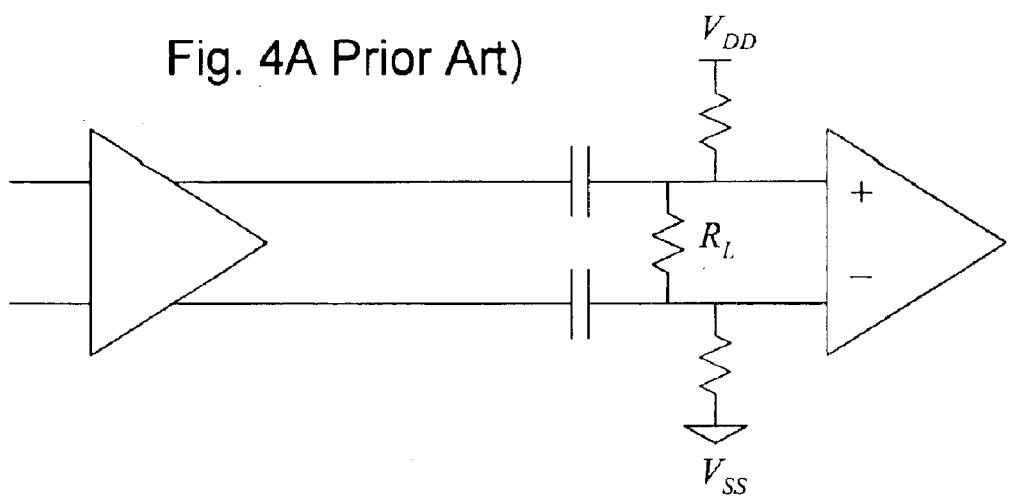
FIG. 4A is a schematic of a prior art AC-coupled differential driver and receiver, with logic bias offset circuitry that ensures a logic 1 is received if the driver is disconnected.
Figure 4B:
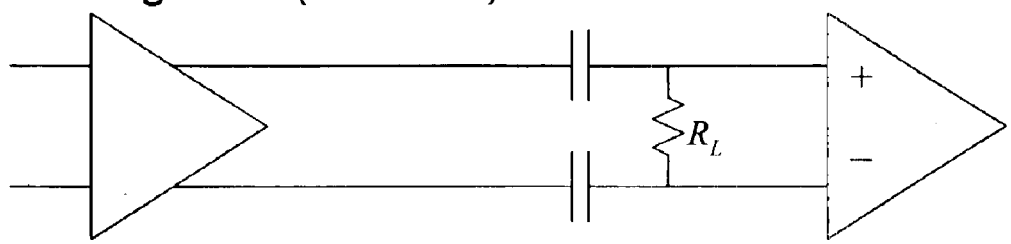
FIG. 4B is a schematic of a prior art AC-coupled differential driver and receiver, with no bias circuitry.
Figure 4C:
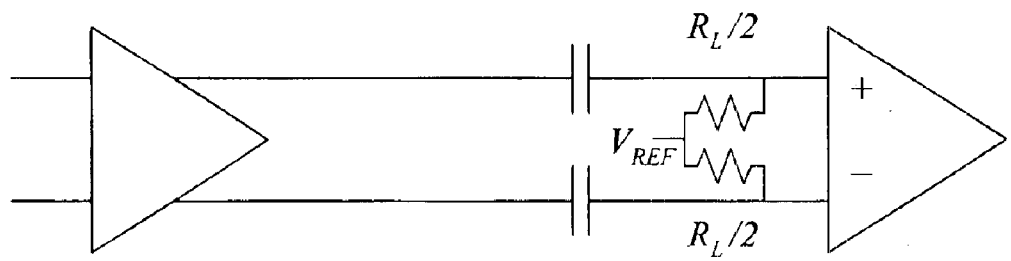
FIG. 4C is a schematic of a prior art AC-coupled differential driver and receiver, with bias circuitry that also serves as a termination resistance.
Figure 4D:
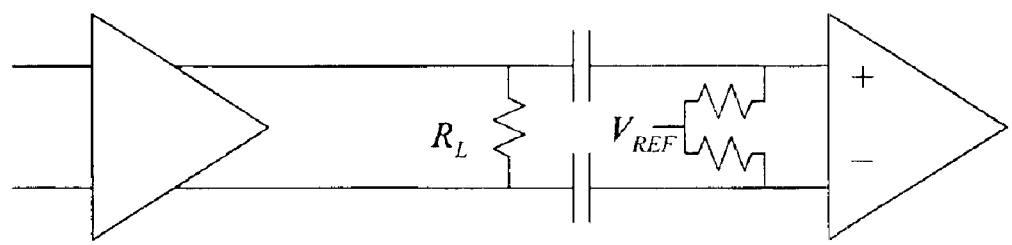
FIG. 4D is a schematic of a prior art AC-coupled differential driver and receiver, with high impedance bias circuitry that permits very small capacitors to be used.
Figure 5:
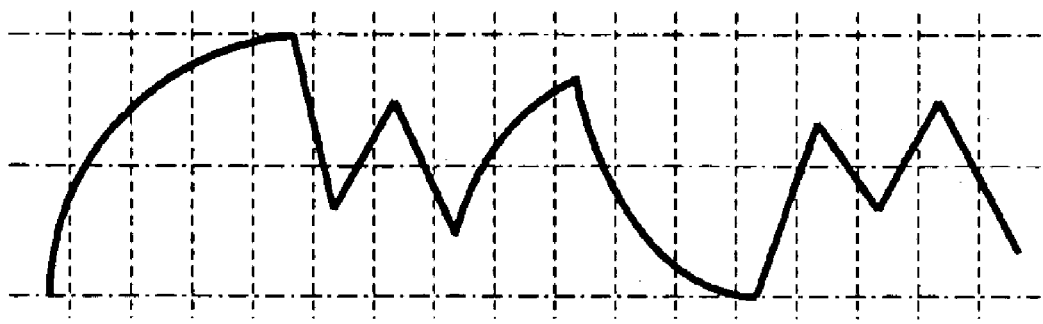
FIG. 5 is a waveform of a prior art digital signal that has been low pass filtered to add data-dependent jitter.
Figure 7A:
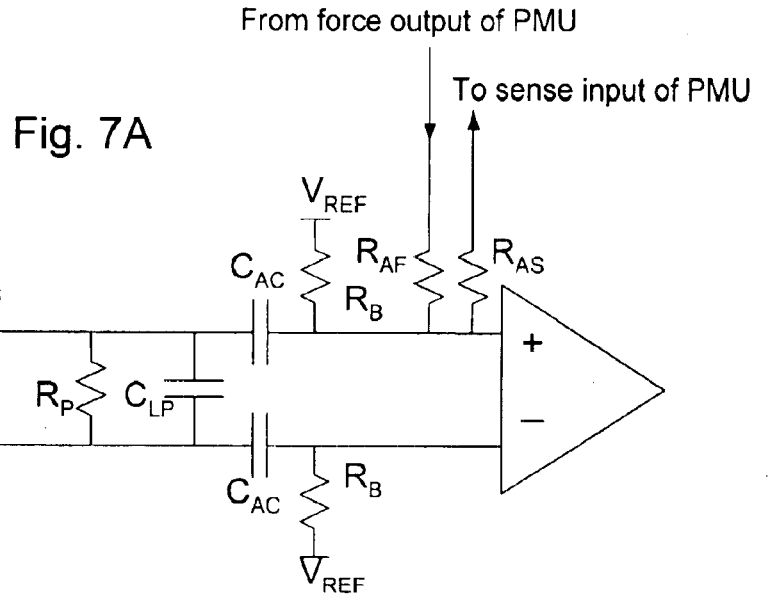
FIG. 7A is a schematic of an AC-coupled differential driver and receiver, with signal attenuation, low pass filtering, bias voltage override, and low frequency test access resistors, according to another embodiment of the present invention.
Figure 7B:
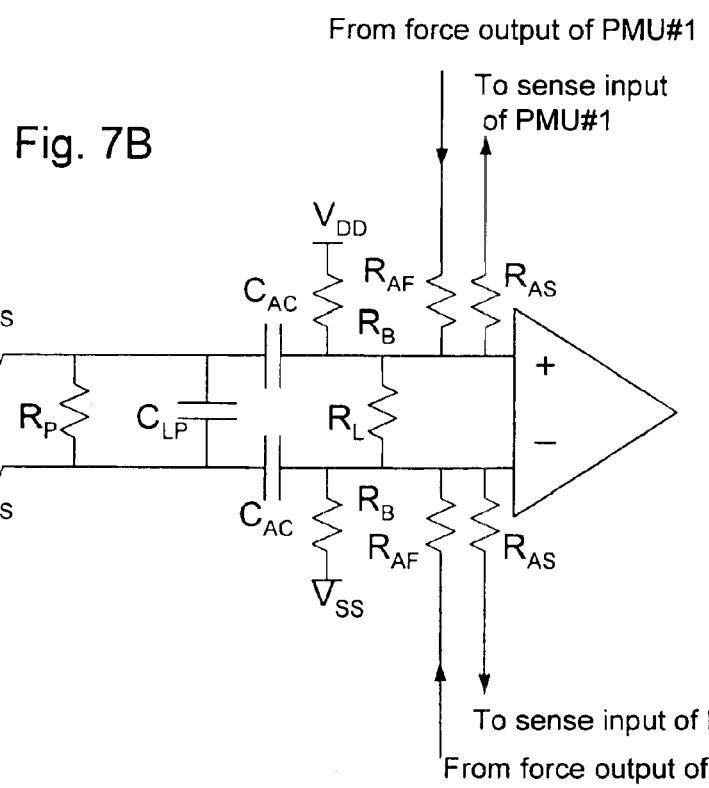
FIG. 7B is a schematic of an AC-coupled differential driver and receiver, with signal attenuation, low pass filtering, logic bias offset, and combined bias voltage override and low frequency test access resistors, according to an embodiment of the present invention.
Figure 8:
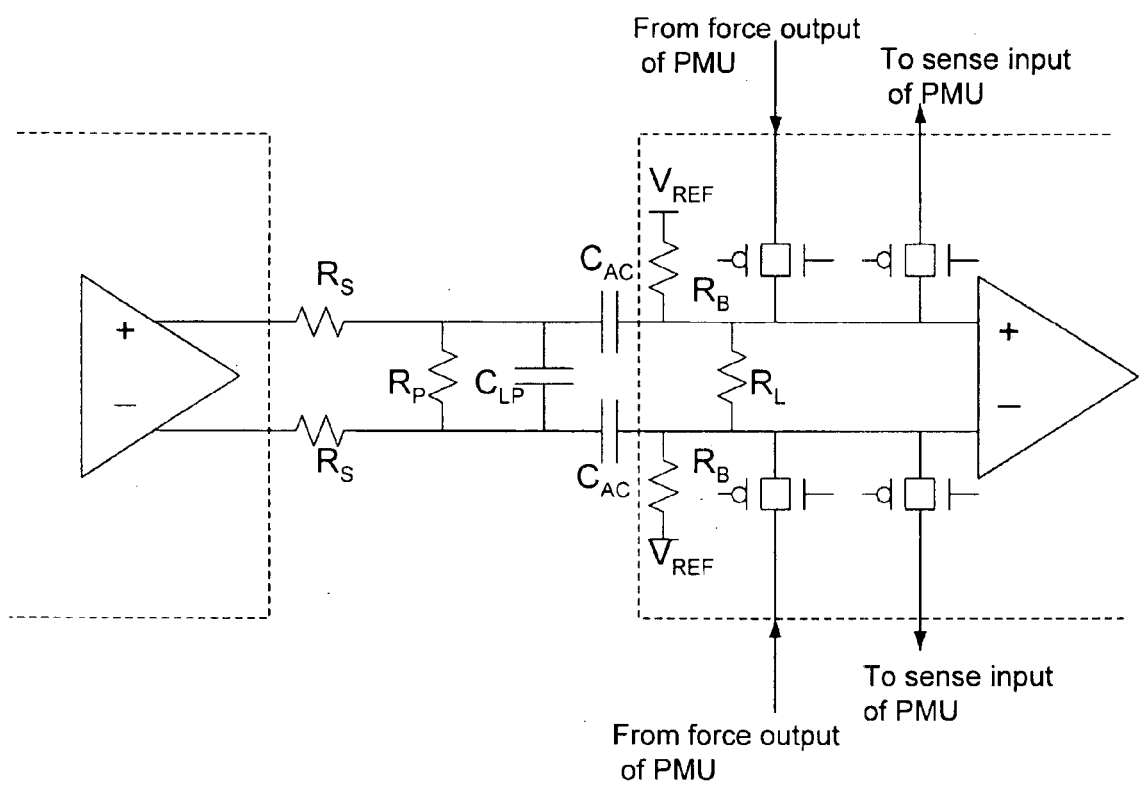
FIG. 8 is a schematic of an AC-coupled differential driver and receiver, with signal attenuation, low pass filtering, and combined bias voltage override and low frequency test access transistors, according to an embodiment of the invention.

Sometimes the bias voltage at a receiver input cannot be adjusted because the signal cannot be disconnected from the non-adjustable bias voltage $V_{REF}$. Solutions for this case are shown in FIG. 7A and FIG. 7B. Referring to these two figures, the average voltage of the signals at the receiver is sensed via resistors $R_{AS}$. The $R_{AS}$ resistors serve two purposes: isolation to prevent transmission line effects, and low pass filtering the signal when the resistors are connected to a capacitance. The average voltage of the signals is forced to a desired voltage via the $R_{AF}$ resistors. The $R_{AF}$ resistor connected to each signal node conveys the forcing current to the node, and the $R_{AS}$ resistor conveys the sensed voltage away from the node. Access transistors can be used instead of resistors, as shown in FIG. 8, to permit boundary scan controlled access (for example, according to the 1149.4 standard). A parametric measurement unit (PMU), such as that shown in FIG. 1, can be used to force and sense the desired bias voltage. Only the average force current is important for this test—the PMU does not need high frequency capability.

The circuit of FIG. 7B will typically require more force current than the circuit of FIG. 7A because the bias resistor in FIG. 7A is typically relatively high impedance (for example, 10k ohms) and because the relatively low impedance termination resistor $R_L$ must be over-driven in the circuit of FIG. 7B. For example, for the circuit of FIG. 7A having a 10k ohm bias resistor and 100 mV eye-opening, the maximum force current needed is 10 µA. For the circuit of FIG. 7B having a 100 ohm termination resistor $R_L$ and similar eye-opening, the maximum force current will be 1 mA.

Figure 9:
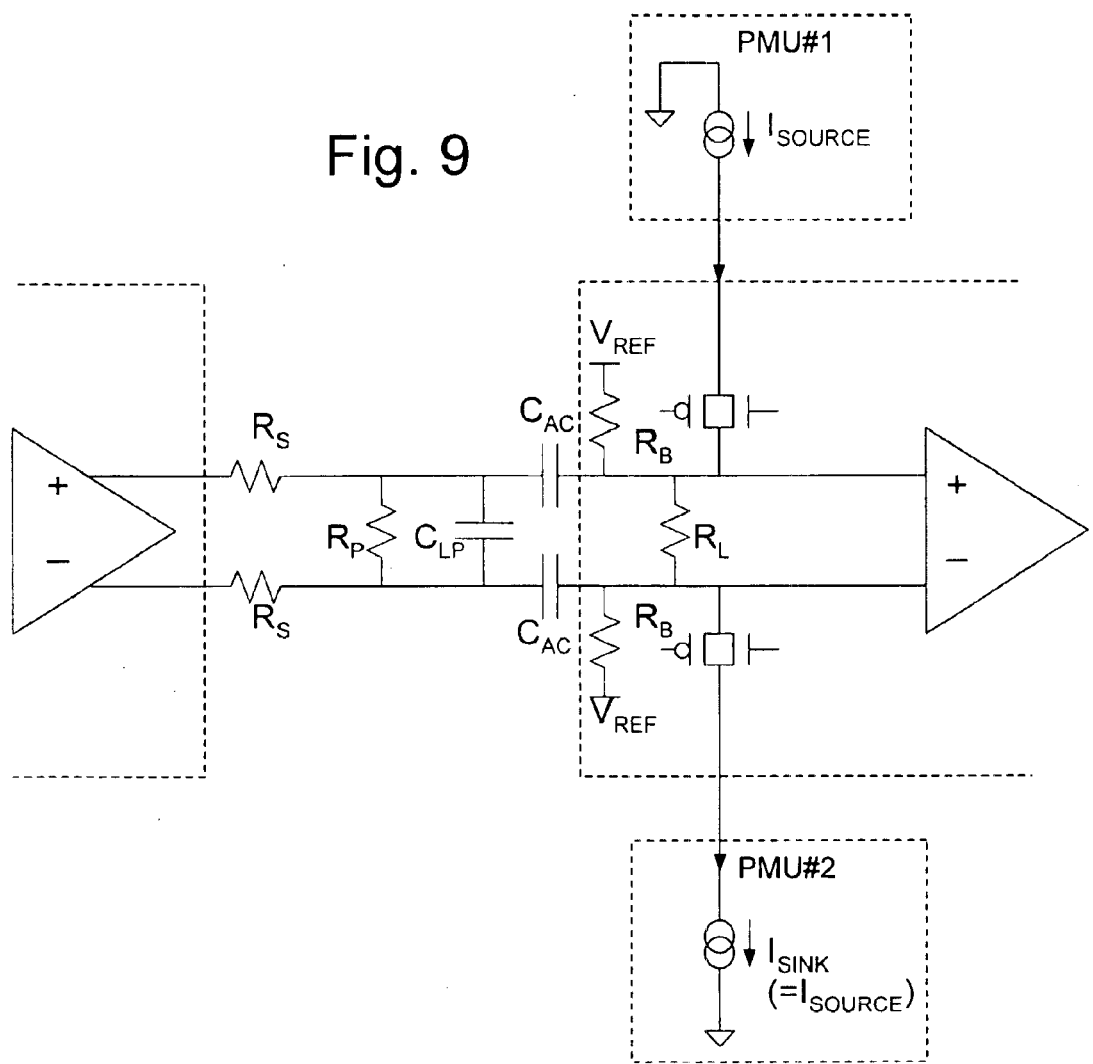
FIG. 9 is a schematic of an AC-coupled differential driver and receiver, with signal attenuation, low pass filtering, logic bias offset, and combined bias voltage override and low frequency test access transistors for access via two analog buses, according to an embodiment of the invention.

To be able to force/sense the voltage on each of the pins of a differential pair, as shown in FIG. 7B and FIG. 8, using only on-chip access via analog buses, four analog bus wires are needed. It is possible to force the desired decrease in the eye-opening using only two analog buses or two resistors, as is shown in FIG. 9. For example, to cause a 20 mV decrease in the eye-opening, a DC voltage is induced across the termination resistor $R_L$ by sourcing $I_{SOURCE}$=0.20 mA through one analog bus and sinking $I_{SINK}$=0.20 mA through the other analog bus. This current causes an average voltage drop across the resistor $R_L$, equal to the DC current multiplied by the resistor's resistance. Because the bus-applied source and sink currents are equal, no current goes into the bias resistors, therefore, there is no change in the common mode voltage of the differential pair (the average of the inverted plus non-inverted signal voltages). Of course, the common mode voltage can be intentionally shifted by making the two currents not equal—the circuit of FIG. 7A (and the related method) permits applying a different current to one of the signals to shift its common mode voltage and hence the common mode voltage of the differential pair.

For drivers that have pre-emphasis, the BER can be measured with and without the pre-emphasis. The RC will result in a significant difference between the two BERs, and hence test that the pre-emphasis is functioning correctly.

For all of the tests described herein, test limits for the bit error rates measured may be determined by characterizing known good devices and known bad devices.

Typically, the bit errors will occur for the transition bits (the first 1 after a 0, or the first 0 after a 1), which means that only the overall BER needs to be measured. For more accurate measurements and better diagnosis of failures, the BER should be measured for specific bit locations in the periodic pattern. For example, in step 4 which applies an isolated 1 in a group of 0's, the BER is measured only for the isolated bit and not for the other transition bits.

The important capability provided by the circuit and method of the present invention is the ability to accurately decrease the eye-opening using low frequency access, which economically increases the BER to levels that can be measured in an economically short time. Prior art circuits and methods are not able to achieve this accuracy without requiring very accurate passive components and/or very high bandwidth test access.

In some cases, the attenuation circuitry might not be needed, or only the capacitor is needed. Although these circuits would not benefit from the attenuation accuracy improvement of the circuitry, the benefits of the adjustable bias voltage circuitry and method are significant. For some circuits, there is sufficient capacitance already present to permit use of the method without the addition of a capacitor.

The circuit and method can also be used for testing analog circuitry—while changing the analog bias, the quality of the conveyed analog signal (which might have been derived from digital data) can be monitored.

It will be seen from the forgoing that the above described embodiments of the invention satisfy the objectives of the present invention. The method and circuitry is capable of parametrically testing circuits that transmit and/or receive high frequency data using only low frequency digital and analog test circuitry and provides signal delivery in a way that is compatible with the IEEE 1149.1, 1149.4, and 1149.6 test access standards.

Although the present invention has been described in detail with regard to preferred embodiments and drawings of the invention, it will be apparent to those skilled in the art that various adaptions, modifications and alterations may be accomplished without departing from the spirit and scope of the present invention. Accordingly, it is to be understood that the accompanying drawings as set forth hereinabove are not intended to limit the breadth of the present invention, which should be inferred only from the following claims and their appropriately construed legal equivalents.

We claim:

1. A method for testing circuits that transmit and/or receive data values via high frequency signals, using only low frequency analog test circuitry, comprising:
   a. coupling a transmitter of said signals to a receiver via a capacitance and connecting an input of said receiver to a bias voltage;
   b. applying a source of DC current to said receiver input via an impedance;
   c. transmitting one or more sequences of different data values while applying one of at least two values of said DC current, including selecting transmitted data values so as to increase the susceptibility of signals to circuit parameters; and
   d. testing received data values.

2. A method according to claim 1, said applying a source of DC current comprises applying a DC constant current source to the receiver.

3. A method according to claim 1, said applying a source of DC current comprises applying a DC constant voltage source to the receiver.

4. A method according to claim 1, said applying a source of DC current includes applying two separate current sources to said receiver when said receiver input is differential.

5. A method according to claim 4, said applying two separate currents sources includes applying two currents which have substantially equal but opposite values.

6. A method according to claim 4, said applying two separate current sources includes applying two DC constant voltage sources whose voltage values are equal to the voltage that would be measured at the outputs of said DC constant current sources.

7. A method according to claim 1, in which said impedance is a resistor.

8. A method according to claim 1, in which said impedance is an inductor.

9. A method according to claim 1, said testing received data values includes measuring bit error rate (BER) of said signals.

10. A method according to claim 1, further including attenuating the signal level of the transmitted signal relative to its maximum signal level.

11. A method according to claim 10, said attenuating the signal level including reducing the drive current of the transmitter.

12. A method according to claim 10, said attenuating the signal level including applying a resistor network between said transmitter and said receiver.

13. A method according to claim 10, said attenuating the signal level including connecting a load capacitor.

14. A circuit for testing circuits that transmit and/or receive data values via high frequency signals, using only low frequency analog test circuitry, comprising:

a transmitter for transmitting said signals;

a receiver for receiving said signals;

a coupling capacitor connected between said transmitter and said receiver; and means for generating a variable bias voltage connected to at least one receiver input;

means for resistively attenuating signals output by said transmitter;

a load capacitor having a value which causes signal transition times greater than one data unit interval connected between said transmitter and said receiver.

15. A method for testing the performance of the input and/or output of a digital circuit, comprising:

attenuating a differential signal applied to or output from said circuit relative to a normal voltage swing of said signal and filtering said signal using a capacitance having a value with a time constant that is comparable to a data bit duration (unit interval) to produce a filtered signal;

AC-coupling said filtered signal to the inputs of a differential receiver whose inputs can be biased to different DC bias voltages;

while monitoring bit error rate (BER) of said signal, adjusting bias voltage to increase or decrease the amplitude of single-ended logic 1's in the filtered signal and adjusting the number of consecutive logic 1's in test patterns used to generate said signal so that said capacitance permits the received edge timing to be adjusted precisely; and calculating the amplitude of the signal based on measured average voltages of the signal while the percentage and grouping of logic 1's in the signal are adjusted.

* * * * *